US005864137A

United States Patent [19]

Becker et al.

[11] Patent Number: 5,864,137

[45] Date of Patent: Jan. 26, 1999

[54] MASS SPECTROMETER

[75] Inventors: Christopher H. Becker, Menlo Park; Steven E. Young, Mountain View, both of Calif.

[73] Assignee: Genetrace Systems, Inc., Menlo Park, Calif.

[21] Appl. No.: 724,210

[22] Filed: Oct. 1, 1996

[51] Int. Cl.[6] .......... H01J 37/26

[52] U.S. Cl. .......... 250/287

[58] Field of Search .......... 250/287, 288, 250/281, 282

[56] References Cited

U.S. PATENT DOCUMENTS

| | | | |
|---|---|---|---|
| 3,553,452 | 1/1971 | Tiernan et al. | 250/41.9 |
| 3,931,516 | 1/1976 | Fletcher et al. | 250/287 |
| 4,047,030 | 9/1977 | Lobach | 250/281 |
| 4,625,112 | 11/1986 | Yoshida | 250/287 |
| 5,148,021 | 9/1992 | Okamoto et al. | 250/288 |
| 5,164,594 | 11/1992 | Thompson et al. | 250/288 |
| 5,300,774 | 4/1994 | Buttrill, Jr. | 250/287 |
| 5,325,021 | 6/1994 | Duckworth et al. | 250/288 |
| 5,365,063 | 11/1994 | Kaesdorf et al. | 250/288 |
| 5,563,410 | 10/1996 | Mullock | 250/287 |
| 5,625,184 | 4/1997 | Vestal et al. | 250/287 |
| 5,627,369 | 5/1997 | Vestal et al. | 250/287 |
| 5,633,496 | 5/1997 | Sakairi et al. | 250/281 |
| 5,665,967 | 9/1997 | Coxon et al. | 250/287 |

FOREIGN PATENT DOCUMENTS

| | | |
|---|---|---|
| 0 771 019 A1 | 5/1997 | European Pat. Off. . |
| WO 94/20978 | 9/1994 | WIPO . |

OTHER PUBLICATIONS

Lubman, Bell and Kronick, "Linear mass reflectron with a laser photoionization source for time–of–flight mass spectrometry," *Anal. Chem.*, 55:1437–1440, 1983.

Moalem et al., "Cluster formation in the vapor produced by laser pulsing of the $Y_1Ba_2Cu_3O_7$ superconducting solid," *J. Vacuum Science and Technology*, 10(5):3292–3299, 1992.

Clarke, N.S. et al. "Laser–Induced Ion Mass Analysis: A Novel Technique for Solid–State Examination," *Vacuum*, 34:911–24; 1984.

Lobada, A. V. et al., "Extraction Pulse Generator for Time–of–Flight Mass Spectrometry," *Review of Scientific Instruments*, 66:4740–41; 1995.

Wu, Kuang Jen et al., "Time–of–Flight Mass Spectrometry of Underivatized Single–Stranded DNA Oligomers by Matrix–Assisted Laser Desorption," *Anal. Chem.*, 66:1637–45, 1994.

Brown. Robert S. and Lennon, John J., "Mass Resolution Improvement by Incorporation of Pulsed Ion Extraction in a Matrix–Assisted Laser Desorption/Ionization Time–of–Flight Mass Spectrometer," *Anal. Chem.*, 67:1998–2003, 1995.

Brown et al., "Pulsed Ion Extraction with High Source Accelerating Fields for MALD Time–of–Flight Mass Spectrometry," *Desorption '94: Mass Spectrometry of Large Organic Ions by Particle and Photon Induced Desorption*, Mar. 27–31, p. 63, 1994.

Cherepin V.T. and Ol'khovsky, V.L., "Performance and Use of Dissector Ion Microanalyzer," *In: Secondary Ion Mass Spectrometry SIMS III*, eds. A. Benninghoven et al., Springer–Verlag, Berlin/New York, 1982.

(List continued on next page.)

*Primary Examiner*—Kiet T. Nguyen
*Attorney, Agent, or Firm*—Arnold, White & Durkee

[57] ABSTRACT

The invention provides a mass spectrometer having improved mass resolution, accuracy, sensitivity, reduced complexity, lower cost, and greater ease of use. The mass spectrometer provided comprises a first electrode and a second electrode, in a nested configuration to create a two-stage acceleration region that accelerates ions across a minimized acceleration region, resulting in decreased metastable decay and improved mass accuracy and resolution. The mass spectrometer also comprises a n alignment system to align the ion optics with the laser beam used for desorption/ionization. The mass spectrometer further comprises electrical circuits for delivering high voltage pulses for pulsed delayed ion extraction.

41 Claims, 9 Drawing Sheets

OTHER PUBLICATIONS

Christian, N.P. et al., "High Respolution Matrix–Assisted Laser Desorption/Ionization Time–of–flight Analysis of Single Stranded DNA of 27 to 68 Nucleotides in Length," *Rapid Comm. Mass Spectrometry*, 9:1061–1066, 1995.

Colby, Steven M et al., "Improving the Resolution of Matrix–Assisted Laser Desorption/Ionization Time–of–flight Mass Spectrometry by Exploiting the Correlation between Ion Position and Velocity," *Rapid Comm. Mass Spectrometry*, 8:865–868, 1994.

Fishkova, T.Ya. et al., "Ion–optical system with energy filtering for sputtering neutral and secondary ion mass spectrometers," *Nuclear Instruments and Methods in Physics Research*, A298: 179–180, 1990.

Grigorov, L.N., "Modification of Input Electron–Optical System of ES–2401 Photoelectron Spectrometer," *Instruments and Experimental Techniques*, 28(4):917–919, 1985.

Johasz, Peter et al., "Applications of Delayed Extraction of Matrix–Assisted Laser Desorption Ionization Time–of–flight Mass Spectrometry to Oligonucleotide Analysis," *Anal. Chem.*, 68:941–946, 1996.

Karas, M. and Bahr, U., "Laser desorption mass spectrometry," *Trends Anal. Chem.*, 5(4):90–93, 1986.

King, Timoth B. et al., "High Resolution MALDI–TOF mass spectra of three proteins obtained using space–velocity correlation focusing," *Int'l J. Mass Spectrometry and Ion Proceeses*, 145:L1–L7, 1995.

Magee, C.W. et al., "Secondary Ion Quadrupole Mass Spectrometry for Depth Profiling—Design and Performance Evaluation," *Rev. Sci. Instrum.*, 49(4):477–485, 1978.

Vestal, M.L. et al., "Delayed Extraction Matrix–assisted Laser Desorption Time–of–flight Mass Spectrometry," *Rapid Comm. Mass Spectrometry*, 9:1044–1050, 1995.

Whittal, Randy M and Li, Liang, "High–Resolution Matrix–Assisted Laser Desorption/Ionization in a Linear Time–of–Flight Mass Spectrometer," *Anal. Chem.*, 67:1950–1954, 1995.

Wiley, W.C. and McLaren, I.H., "Time–of–Flight Mass Spectrometer with Improved Resolution," *Rev. Scientific Instruments*, 26(12):1150–1157, 1955.

MASS SPECTROMETER

ACKNOWLEDGEMENTS

This invention was supported in part by a Financial Assistance Award from the United States Department of Commerce, Advanced Technology Program, Cooperative Agreement #70NANB5H1029. The U.S. Government may have rights in this invention.

INTRODUCTION

Background

Mass spectrometers are useful devices for detailed chemical analysis of samples and are commonly used in a number of fields, including the biochemical and biomedical arts, forensics, and chemistry. The sample may, for example, comprise proteins, polynucleotides, carbohydrates (biopolymers), or synthetic polymers embedded in a matrix or without a matrix. The sample may also comprise small organic and inorganic molecules.

In a typical time-of-flight mass spectrometer, the sample is desorbed and ionized (often concomitantly) to produce an initial plume of ions. The ionization is accomplished by means of an ionizer, which may, for example, be a laser beam or an ion beam. Ions are extracted from this plume and accelerated in an electric field. Typically, they are then permitted to drift for a short time through a region of zero electric field before they strike an ion detector. The time of flight of the ions is measured from the time of their ionization to the time that they strike the ion detector, and this information is used to determine their identities.

After passage through the electric field, each ion acquires a velocity inversely proportional to the square root of the ratio of the mass of the ion to the charge on the ion (m/z ratio). This means that the time of flight is proportional to the square root of the m/z of each ion. By measuring the time of flight of each ion, the mass-to-charge ratio of each ion can be determined. A mass spectrum of the sample is generated from the intensity of detected ions as a function of time.

However, the ions desorbed by the ionizing beam may have nascent kinetic energy from the desorption process itself. Because the initial velocity of an ion affects its time of flight, this nascent kinetic energy may adversely affect the accuracy, resolution, and sensitivity of the mass spectrometer. Identical ions having different nascent energies will move at different velocities, and thus have different time of flight values. This initial kinetic energy distribution of ions, which may be as high as 100 electron volts, degrades the accuracy, resolution, and sensitivity of the mass spectrometer and is responsible for relatively low mass resolution in prior art time-of-flight mass spectrometers.

Metastable decay is believed to be another cause of low mass resolution in mass spectrometers. Metastable ions may break up, and if this fragmentation occurs during acceleration in the electric field, the fragments of the original ion will be accelerated to different velocities and have different times of flight. This results in energy spreads which degrade the resolution of the time-of-flight spectrum, and the fragments can appear as incoherent noise in the baseline of the mass spectrum. The problem of metastability may worsen where the sample ions are large, complex molecules, particularly if they are also fragile, such as polynucleotides.

Furthermore, a significant number of neutral particles are generated by the desorption/ionization process. These neutral particles are not accelerated by the electric field, and thus do not contribute to the analysis of the sample. Nonetheless, the neutral particles may gain considerable nascent kinetic energy from the desorption process which is highly directed normal to the sample surface, and travel through the time-of-flight tube to bombard the ion detector. It is therefore desirable to reduce the neutral particle flux toward the ion detector in order to reduce noise and increase the life of the ion detector.

Accordingly, there is a need for a mass spectrometer with increased accuracy, resolution, and sensitivity. The present invention provides for a novel apparatus which solves the above-mentioned problems and others.

SUMMARY OF THE INVENTION

The invention provides a mass spectrometer having improved mass resolution, accuracy, sensitivity, reduced complexity, lower cost, and greater ease of use. In an illustrative embodiment, an array of samples is placed on an x-y translation stage in the mass spectrometer underneath the ion optics. Two nested ion extraction electrodes are used, which create a two-stage acceleration region. The funnel-shaped first electrode is substantially conical, with an aperture at its vertex for passage of the ions of the sample, and oriented with its vertex toward the sample. The second electrode is typically substantially tubular, but may also be conical, with a leading surface protruding into the interior volume of the first electrode at the non-vertex (base) end of the first electrode.

The ion-extraction electrodes must be mounted in close proximity in order to make the acceleration region as short as possible. However, because they may be at different electrical potentials in operation, they must also be electrically isolated from each other. The electrodes are provided with flat mounting surfaces at their peripheries, which may be accomplished by welding the electrodes to mounting plates having holes in them for the electrodes. The electrodes with their mounting plates are then supported by rods made from alumina or other suitable nonconductive material. A vacuum is created inside the mass spectrometer, and this vacuum acts as a dielectric between the two electrodes.

The first acceleration region is between the sample, which ideally has a quasi-planar surface, and the first electrode. The second acceleration region is between the inner surface of the first electrode and the leading surface of the second electrode. In the preferred embodiment, a first power source is used to apply a large DC bias voltage to both the sample and the first electrode, while a second power source is capacitively coupled to the sample to provide a voltage pulse. The second electrode is held at ground. As will be described in further detail, only two power supplies are used and need not be electrically isolated from ground ("floated").

The time-of-flight (TOF) tube is placed at a slight angle to the initial (undeflected) path of the ions through the ion optics, such that there is no line-of-sight from the sample to the ion detector. Horizontal deflecting plates are placed along the path of the ions in a post-acceleration region free of accelerating electric fields to deflect the ion beam path to follow the TOF tube.

Also provided is an alignment system for aligning the ion optics with the laser beam used for desorption/ionization. A small tube is attached to the side of the TOF tube at a slight angle. The small tube has its axis along the line-of-sight through the ion optics to the sample. The small tube has an alignment light placed such that it shines through the small tube, TOF tube, the ion optics, and through the aperture in the conical first electrode to project a disc of light onto the sample. The lasing apparatus, which typically includes an adjustable steering mirror, is adjusted to bring the laser beam into alignment by centering the laser beam within the disc of light on the sample under the ion optics.

In operation, the first power source supplies a DC bias to both the sample stage and the first electrode, and the second electrode is held at ground. A laser beam is used to desorb and ionize the sample. After a predetermined delay after the laser beam strikes the sample, a high voltage pulse is capacitively coupled to the sample on top of the DC bias. In an alternative embodiment, the high voltage pulse could be applied to the first electrode rather than the sample.

The ions are accelerated by the electric fields created by the nested ion extraction electrodes and passed through an Einzel lens to focus the ions. A deflecting voltage is applied to the horizontal deflecting plates, and the resulting electric field deflects the ions to follow the angled TOF tube. This electric field does not deflect the neutral particle flux to the ion detector, and thus the ion detector is relatively protected from neutral blast. The ions are allowed to drift in a zero electric field region along the time-of-flight tube until they reach an ion detector, which detects the impact of the ions. The mass-to-charge (m/z) ratios of the ions are calculated from their times of flight.

The invention finds particular application in, but is not limited to, time-of-flight mass spectrometers using matrix-assisted laser desorption/ionization. For example, ionization may also be accomplished by another ionizer which uses electrons or ions impacting the surface, electrospray ionization, or photoionization or electron impact ionization above the surface.

A primary advantage of the invention is that the mass resolution of the mass spectrometer is improved, due to minimization of the effect of nascent kinetic energy, and higher total acceleration over a shorter time interval (shorter distance) which minimizes the effect of metastable decay.

Another advantage of the invention is that only two power supplies are needed for ion acceleration, and the pulsing voltage supply does not need to be floated, which is of particular advantage when using the extremely high voltages required in this application. Nor is it necessary to generate a very large voltage pulse corresponding to the absolute voltage attained for ion acceleration. The complexity and cost of the apparatus are thus significantly reduced.

Still another advantage of the invention is that neutral particle flux to the ion detector is reduced, resulting in lower background noise, improved resolution, and increased service life of the detector.

Yet another advantage of the invention is that the laser beam or other ionizer used for ionization may be rapidly and easily aligned with the aperture of the ion optics, reducing the downtime required for alignment and simplifying the process.

A further advantage of the invention is that the lack of exposed surface area normal to the ion flux from the sample and reduced surface area resulting from the conical shape of the first electrode reduces deposition from desorbed material, and facilitates entry of the ionizing source (laser beam) at a nonglancing angle of incidence (i.e. greater than 25°) with respect to the surface of the sample.

These advantages and further details of the present invention will become apparent to one skilled in the art from the following detailed description and accompanying drawings.

DESCRIPTION OF SPECIFIC EMBODIMENTS

Figure 1A:
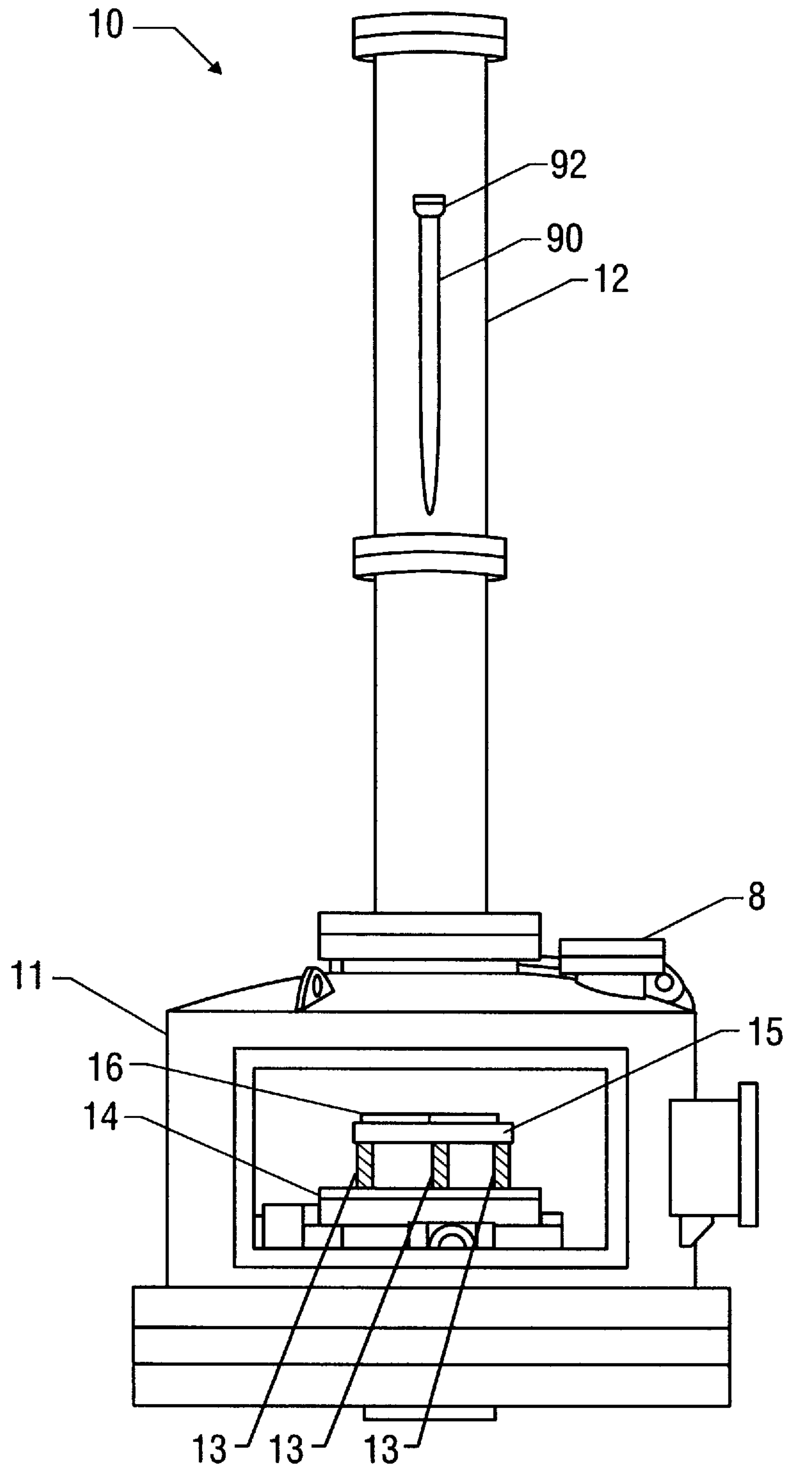
FIG. 1(A) is a front view of a mass spectrometer in accordance with the invention.
Figure 1B:
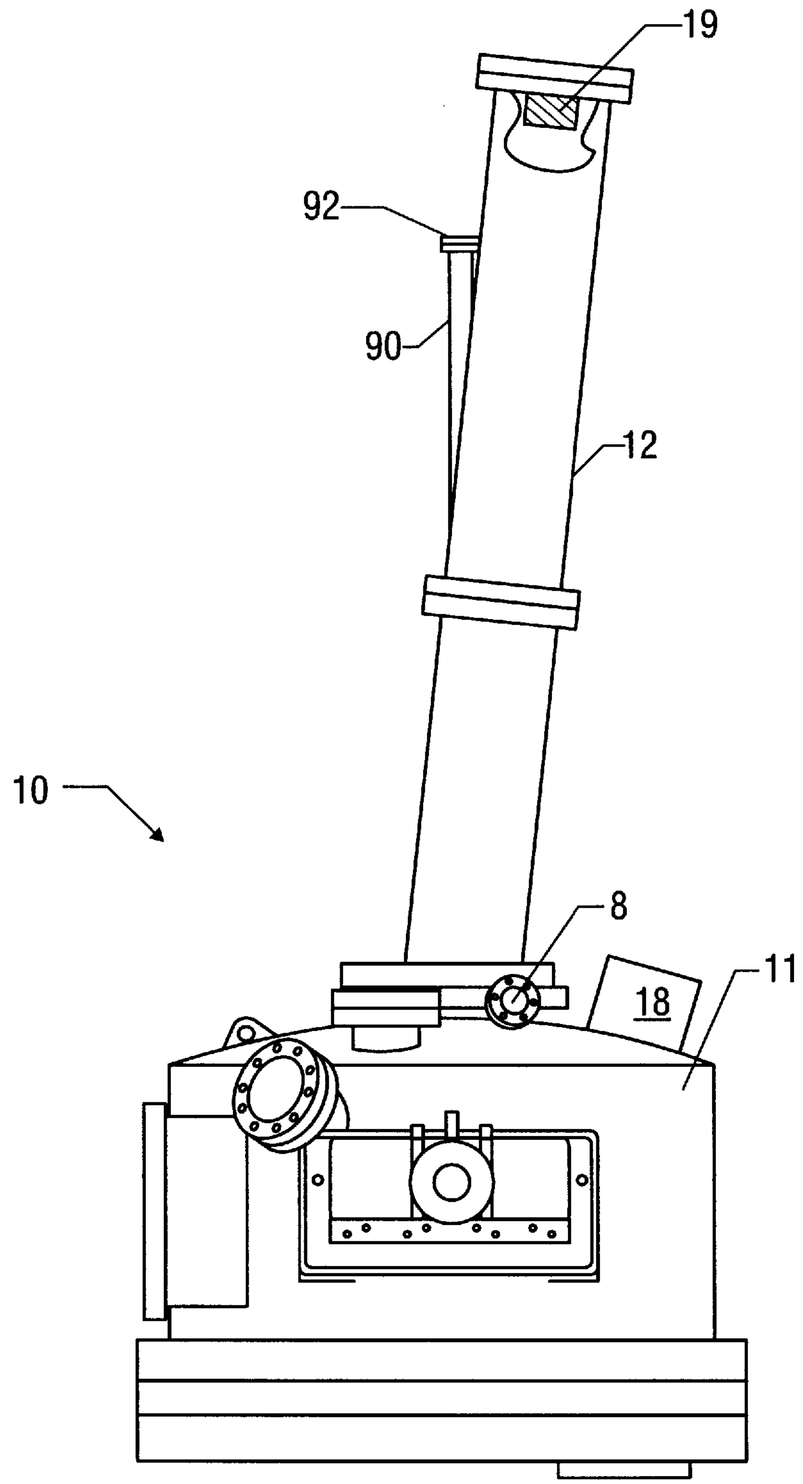
FIG. 1(B) is a side view of the mass spectrometer of FIG. 1(*a*)
Figure 1C:
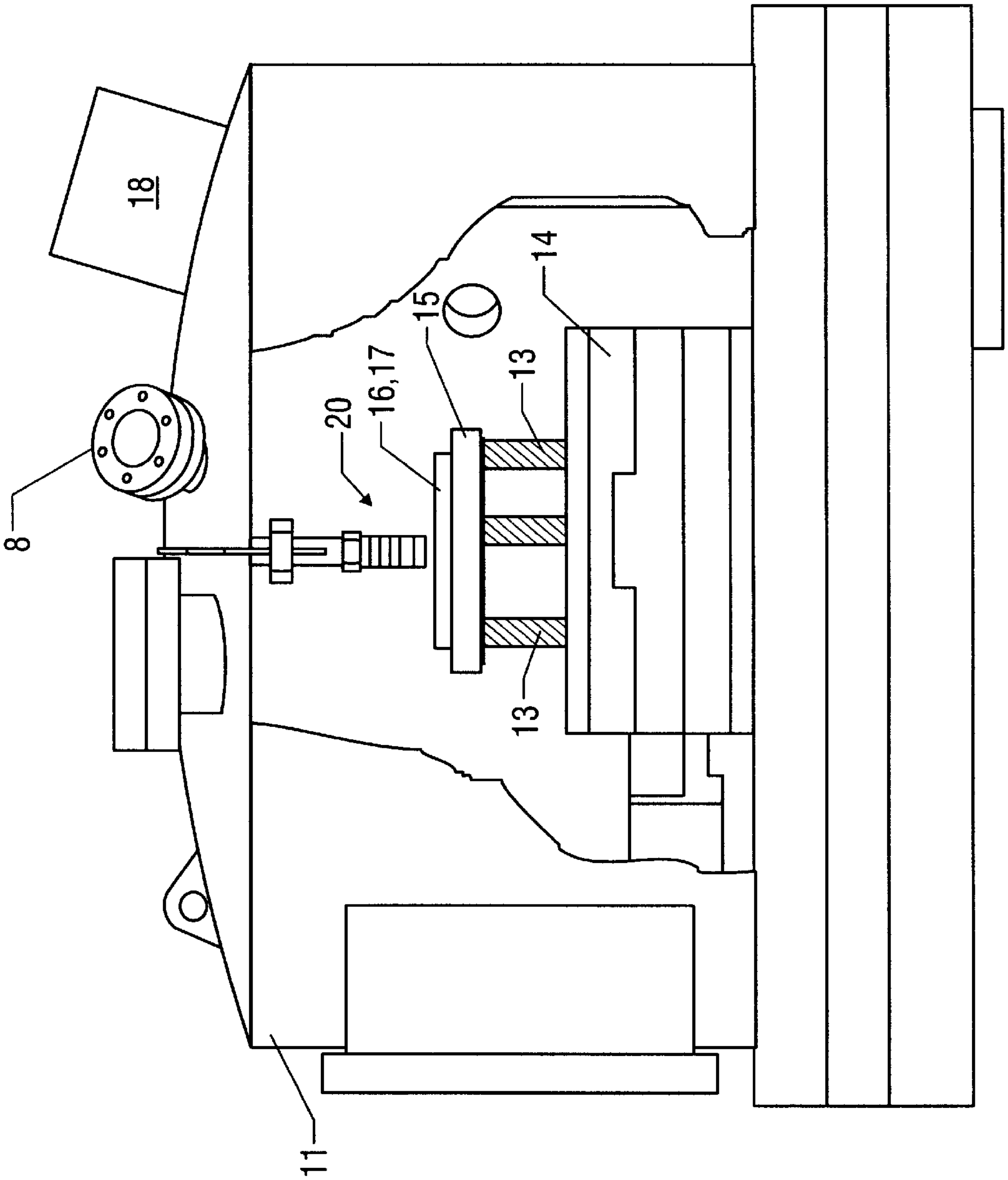
FIG. 1(C) is a magnified cut-away view of a portion of the mass spectrometer of FIG. 1(B)

A time-of-flight (TOF) mass spectrometer in accordance with the invention is shown in FIGS. 1(A), (B), and (C). As will be apparent from the description below, the mass spectrometer 10 has several features which increase its resolution, reduce cost, and improve its ease of use. By way of non-limiting disclosure, the invention will be described with reference to its application in Matrix-Assisted Laser Desorption and Ionization (MALDI).

The TOF mass spectrometer 10 comprises a main chamber 11, a TOF tube 12, a lasing apparatus 18, an x-y translation stage 14, ion optics 20, and an ion detector 19 placed in the top portion of the TOF tube 12. Main chamber 11 and TOF tube 12 form a vacuum chamber, which is pumped by various means to $10^{-5}$ to $10^{-9}$ torr, preferably from $10^{-7}$ to $10^{-9}$ torr. The sample 16 being analyzed, along with other samples 17, is supported on a sample holder 15 which is electrically isolated from the x-y translation stage 14 by ceramic standoffs 13. For illustration purposes, the sizes of the samples 16 and 17 have been exaggerated in FIGS. 1(A) and (C) though they would ordinarily be too small to be seen at this scale.

The lasing apparatus, which preferably includes a frequency-tripled or frequency-quadrupled Nd:YAG laser producing sub-20 ns pulses at 355 nm or 266 nm with at least a few hundred microjoules of energy per pulse, is operated to produce a laser beam which desorbs and ionizes part of the sample 16. A steering mirror 5 directs the light through a window on a vacuum flange 8 toward the sample 16.

Ions are extracted from the ion plume created by the laser beam, and the ions are focused and accelerated through the TOF tube 12 to strike the ion detector 19, which senses their presence and produces a signal corresponding to the mass spectrum of the sample 16. The TOF tube 12 (or time-of-flight tube axis 2) is placed at an angle 4 to the initial, undeflected path of the ions 3. The angulation of the TOF tube 12 may range from 3 to 10 degrees from the path of the ions through the ion optics, and is preferably 4° or 5°. Typically, the sample 16 is placed with its surface orthogonal to the axis of the ion optics, and thus, the angulation of the TOF tube 12 is preferably 4° or 5° from the line perpendicular to the sample 16.

ELEMENTS OF THE APPARATUS

1. ION OPTICS

Details of the ion optics, particularly the funnel-shaped first electrode 22 and the cylindrical second electrode 32, may be seen by reference to FIGS. 2(A), 2(B), 3(A), and 3(B). In the preferred embodiment, the first electrode 22 has a conical shape with a 4 mm aperture 24 at its vertex, and is mounted at a proximal end 26 of the ion optics closest to the sample 16 on the sample holder 15. The conical first electrode 22 is provided with a mounting flange 28 at its periphery, which may be accomplished by welding or otherwise affixing the conical electrode 22 to a mounting plate having a circular opening for the cone. The mounting flange 28 is secured to four supporting rods 30, which are made from an insulating material, typically a ceramic such as alumina or glass. The conical electrode 22 is oriented with its aperture 24 closest to the sample 16, at a distance of approximately 5 mm, and is typically made from a metal such as stainless steel. The distance between the aperture 24 and the sample 16 may range from 3 mm to 7 mm, and is influenced by two considerations: 1) it is desirable to accelerate the ions over as small an interval as possible, to reduce the possibility of metastable decay of ions under acceleration; and 2) a smaller gap increases the likelihood of arcing, particularly at the high voltages present in this apparatus.

The second electrode 32 is cylindrically shaped, and like the first electrode 22, has a mounting flange 34. The mounting flange 34 of the second electrode 32 is secured to the four supporting rods 30 at a minimum distance of approximately 0.35" (approximately 9 mm) from the first electrode mounting flange 28. The second electrode 32 is placed with its proximal end 36 oriented toward the sample 16 and protruding into the interior volume 38 of the first electrode 22 such that the distance from the proximal end 36 of the second electrode 32 to the aperture 24 of the first electrode 22 is approximately 5 mm. This distance may range from 2 mm to 7 mm, and is subject to the same considerations as the distance between the aperture 24 and the sample 16.

The second electrode 32 may be conical or another shape. Preferably, the second electrode 32 is configured such that no part of the second electrode 32 is closer to the first electrode 22 than the proximal end 36 of the second electrode.

It is preferable to smooth the edges of the second electrode 32 to reduce the possibility of arcing between the first and second electrodes 22 and 32, and also to smooth the edges of the first electrode 22 to reduce arcing between the first electrode 22 and the sample 16. As may be seen from the figure, placement of the mounting flange 34 at the distal end of the second electrode 32 maximizes the distance between this mounting flange 34 and the first electrode mounting flange 28.

Figure 2A:
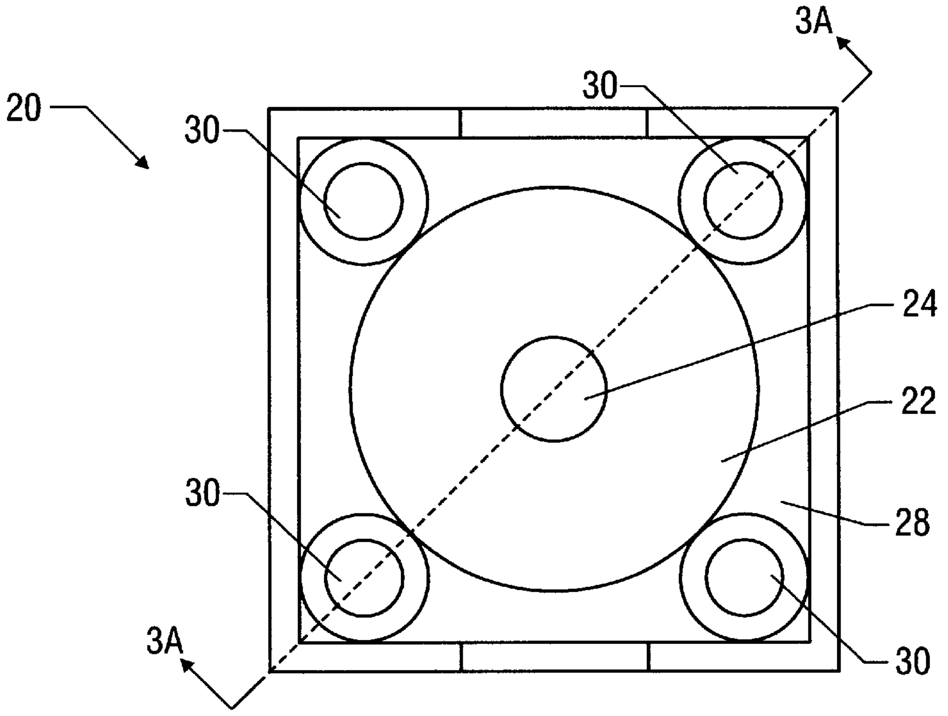
FIG. 2(A) is a bottom view, from the perspective of the sample, of the ion optics in accordance with the invention.
Figure 2B:
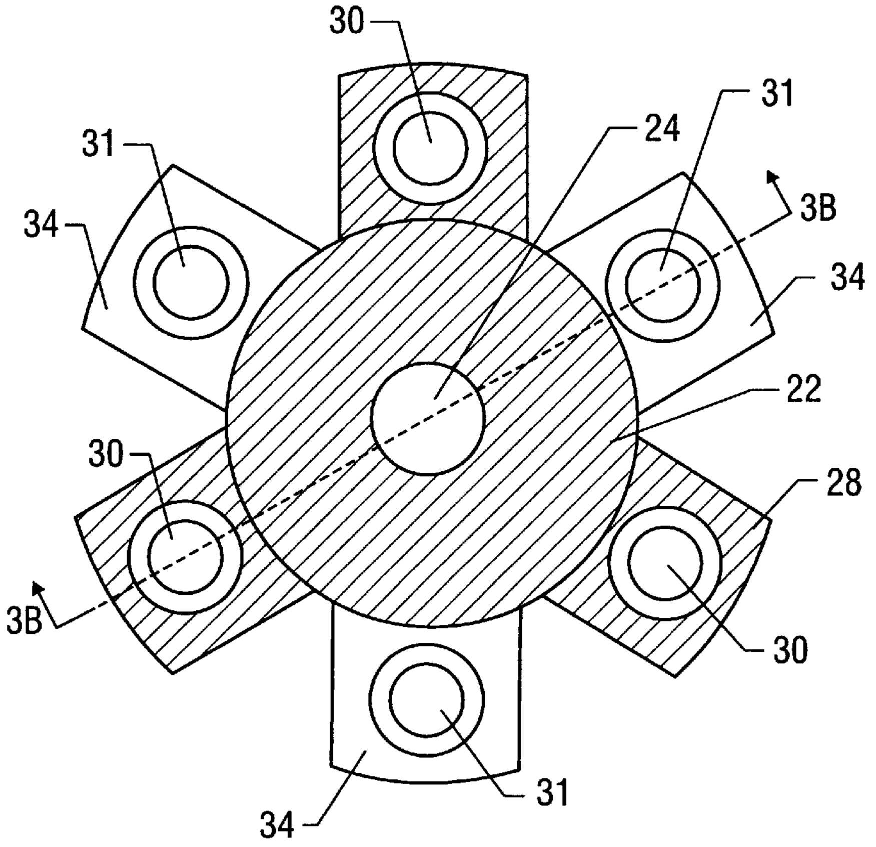
FIG. 2(B) is a bottom view, from the perspective of the sample, of an alternative embodiment of the ion optics.
Figure 3A:
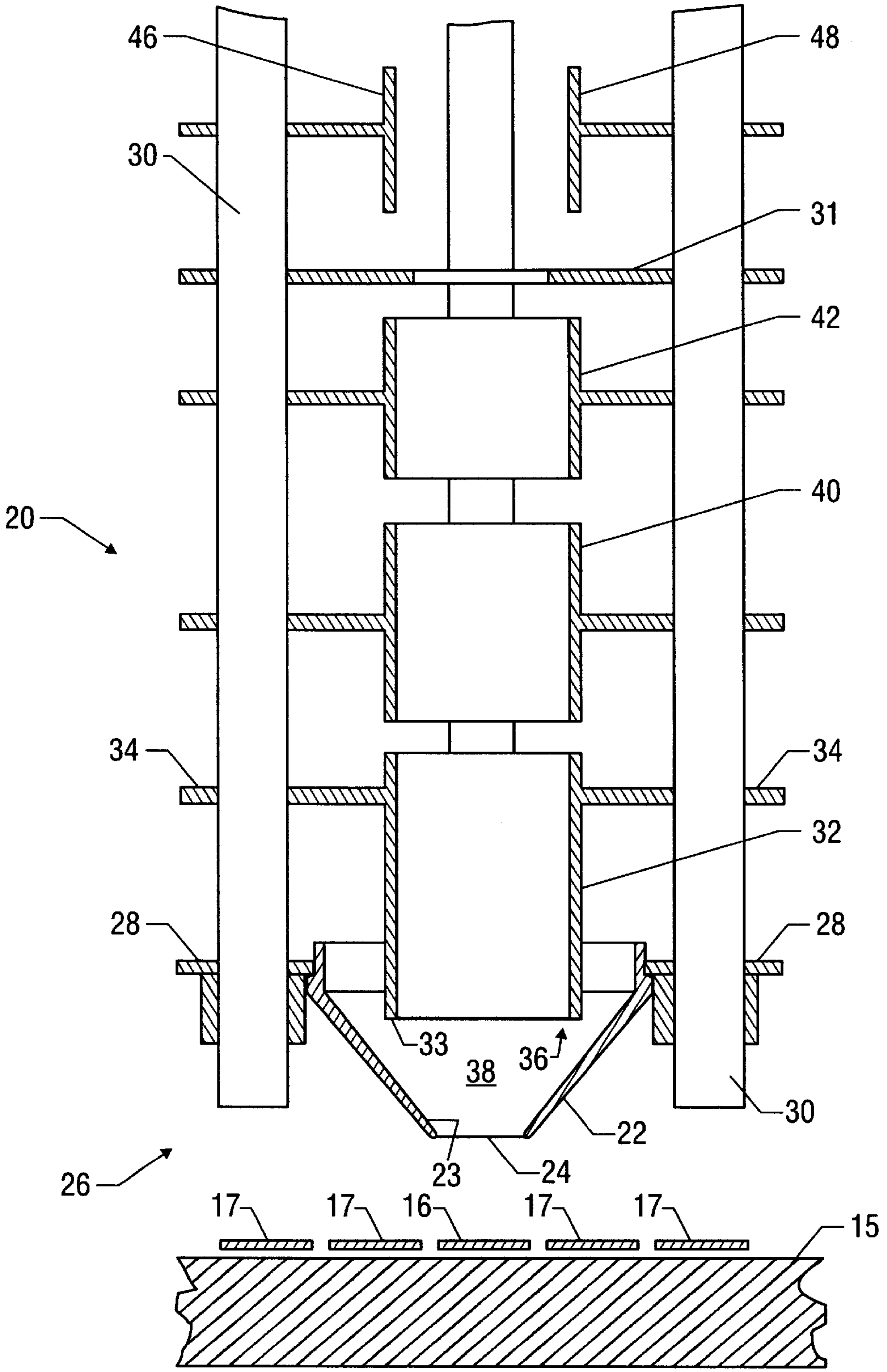
FIG. 3(A) is a sectional view along line **3*a*—3*a*** of the ion optics in accordance with the invention.
Figure 3B:
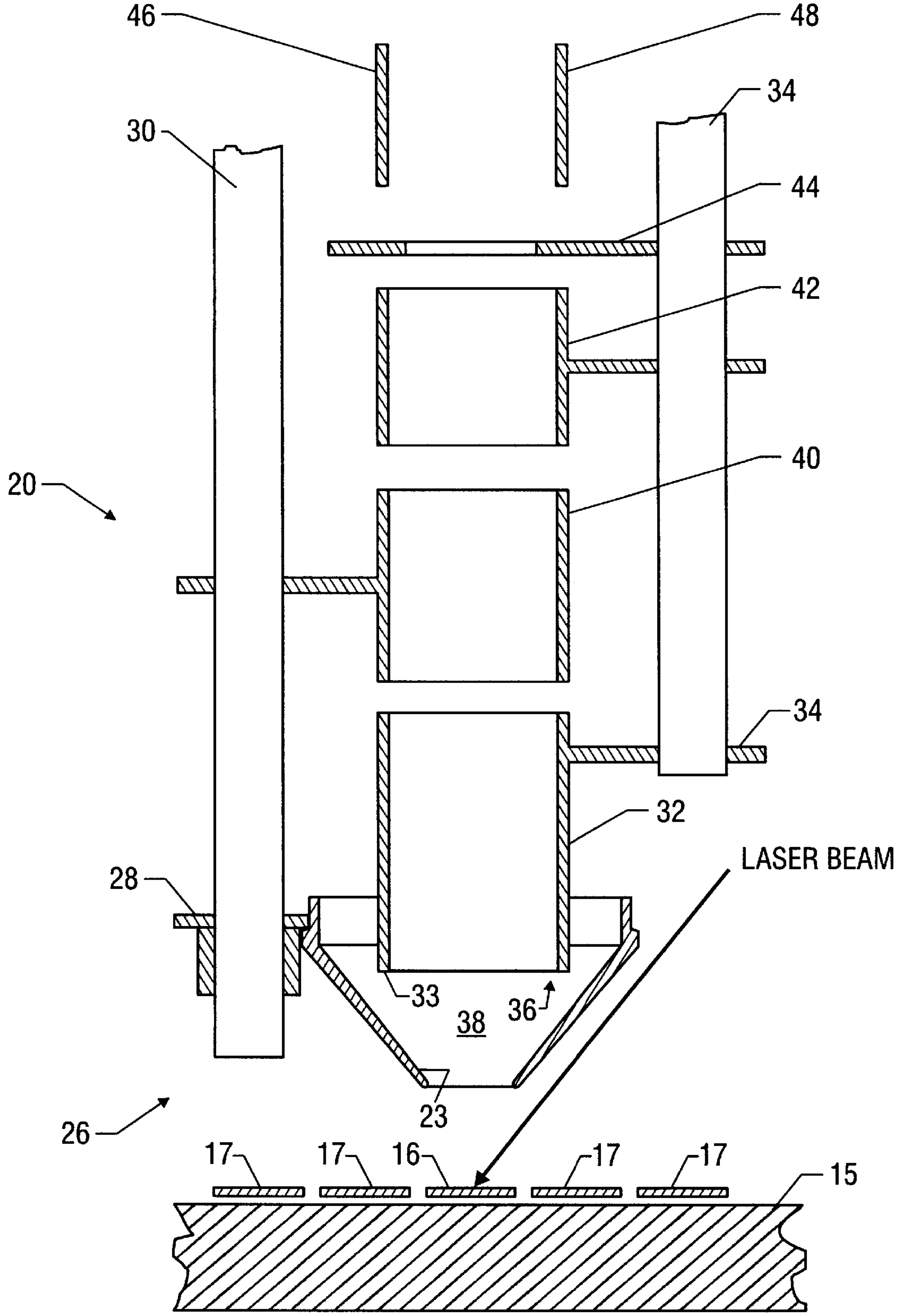
FIG. 3(B) is a sectional view along line **3*b*—3*b*** of the alternative embodiment of the ion optics.

In an alternative embodiment, as illustrated in FIGS. 2(B) and 3(B), the first electrode 22, the Einzel lens 40, and deflector plates 46 and 48 may be mounted on one set of supporting rods 30 while the second electrode 32 and other elements in the ion optics 20 are mounted on a different set of support rods 31 as shown in FIGS. 2(B) and 3(B). This configuration further reduces the possibility of arcing.

To reduce the possibility of arcing still further, particularly when higher voltages and extraction fields are being used, a three-stage acceleration region may be created by means of a third nested electrode placed distal to the second electrode 32. The third electrode may have a tubular, conical, or other shape. Preferably, the third electrode is configured such that no part of the third electrode is closer to the second electrode 32 than the proximal end of the third electrode. This configuration has the advantage of reducing the change in potential per pair of electrodes. It will be apparent to one of ordinary skill in the art that this configuration is scaleable to four or more acceleration regions.

Referring to FIG. 3(A), placed distal to the second electrode 32 is an Einzel lens 40 for focusing the ion flux, and grounded elements 42 and 44. As with the two ion extraction electrodes 22 and 32, these elements 42 and 44 are mounted to the supporting rods 30. Finally, deflector plates 46 and 48 are located distal to the grounded elements 42 and 44. Application of voltage to these plates, typically between 0 and 3 kV, causes the ion flux to be deflected.

As has been described above, the two ion extraction electrodes 22 and 32 are nested and in close proximity to each other. Placing the sample 16 and sample holder 15, and the two electrodes 22 and 32 at different potentials creates a two-stage acceleration region. As described above, the x-y translation stage 14 is electrically isolated from the sample holder 15 by ceramic standoffs 13. The first acceleration region is between the sample 16, which ideally has a quasi-planar surface, and the first electrode 22. The second acceleration region is between the aperture 24 of the first electrode 22 and the leading surface 33 of the second electrode 32.

In operation, the sample 16 and the first electrode 22 are driven by a DC bias voltage of 18 kV, while the second electrode 32 is held at ground. The DC bias voltage may range from 10 kV to 30 kV. The lasing apparatus 18 delivers an ionizing pulse to the sample 16 to desorb and ionize it. An ion plume develops, and after a short delay after the ionizing pulse, a voltage pulse of 10 kV is applied to the sample 16, causing the sample 16, first electrode 22, and second electrode 32 to be at different potentials. The delay ranges from 50 ns to 1000 ns, and is typically chosen according to the principal mass range of interest. The voltage pulse may range from 3 kV to 30 kV. When the voltage pulse is applied, the total potential difference from the sample 16 to the second electrode 32 is then 28 kV. Thus, a two-stage acceleration region is created, and the ions are accelerated to a speed determined by their mass-to-charge ratio. It will be readily apparent to one skilled in the art that variations of the preferred embodiments disclosed herein are within the scope of the present invention.

This pulsed delayed ion extraction compensates for the nascent kinetic energy of the desorbed ions. A detailed description of pulsed delayed ion extraction (also called "time lag energy focusing") may be gleaned by reference to W. C. Wiley and I. H. McLaren, "Time-of-Flight Mass Spectrometer with Improved Resolution," *The Rewiew of Scientific Instruments*, Vol. 26, No. 12, pp. 1150–1157 (1955), hereby incorporated by reference.

It is desirable to accelerate the ions as quickly as possible, particularly for mass spectrometry analysis of large molecules with high mass-to-charge ratios. This is due to metastability of the large ionized molecules of the sample 16. If the metastable ions fragment during acceleration in the electric field regions of the ion optics, they are accelerated to different speeds and thus have different flight times which are often not consistent with the characteristics of the fragments themselves. The fragmented ions generally appear as incoherent noise in the mass spectrum's baseline or as broadened peaks, thereby degrading the resolution and sensitivity of the time-of-flight spectrum. However, if any metastable ions survive long enough to be accelerated out of the acceleration region, they will appear at the same flight time as stable ions even if the metastable ions fragment in the zero electric field region.

To mitigate the effects of metastability, the electric field must be as strong as possible. This requires placing a large potential across a small distance. However, for sufficiently large voltages and small distances, arcing may occur. These conflicting parameters are balanced by the structures disclosed above. The small distance between the first electrode 22 and second electrodes 32 near its leading surface 33 minimizes the length of the second stage of the two-stage acceleration region and thus increases electric field strength in this second acceleration region. Thus, higher acceleration of ions over a shorter distance is achieved. At the same time, the distance between the second electrode 32 and the first electrode 22 is maximized at other areas. This is particularly important at their respective mounting flanges 28 and 34 because alumina is a poorer dielectric than the vacuum that exists (since the ion optics 20 are in a vacuum chamber) in the second acceleration region between the first and second electrodes 22 and 32.

The use of a conical first electrode 22 and cylindrical second electrode 32 achieves the goals of maximizing acceleration over a short gap and avoiding voltage breakdown (arcing). It will be apparent to one skilled in the art, however, that other configurations may be used, in which the distance between the first and second electrodes at their proximal ends is minimized relative to any other distance between the first and second electrodes. For example, a second conical electrode may be nested within the first conical electrode, wherein the second conical electrode is more steeply sloped (has a smaller angle at its vertex) than the first.

Use of a conical first electrode 22 facilitates nesting of the electrodes to minimize the length of the second acceleration region relative to the distance between the mounted end of the electrodes. In addition, the conical shape of the first electrode 22 allows the laser light from the lasing apparatus 18 to impinge on the sample 16 while causing the angle of incidence to be relatively close to normal to the surface of the sample 16. In the preferred embodiment, the angle of incidence of the laser beam is 45 to 50 degrees from normal incidence to the sample 16. Alternatively, the laser beam may be passed collinear with the alignment light beam down the alignment tube 90 with the use of an optical beam splitter (not shown).

The conical shape of the first electrode 22, with no exposed surfaces square to the ion flux from the sample 16, presents a relatively reduced cross-sectional area to the sample 16, thus reducing the rate of material deposition (from the desorbed sample 16) on the surface of the electrode 22. Finally, the capacitance between the first electrode 22 and the sample 16 is reduced, resulting in improved pulse shape and amplitude, thereby improving mass resolution.

2. ELECTRICAL CIRCUITS AND POWER SOURCES

Figure 4:
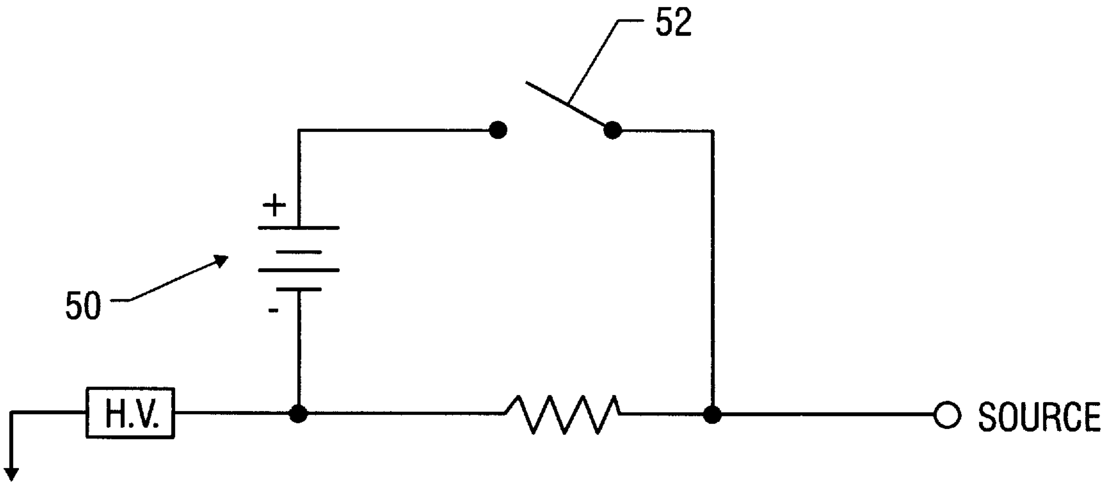
FIG. 4 (prior art)
FIG. 4 is a schematic of a prior art electrical circuit.

As described above, operation of this apparatus requires very high voltages. Typical pulse voltages range from 3 kV to 30 kV with rise times below 100 ns and preferably below 50 ns. In the preferred embodiment, the pulse voltage is 10 kV, with a rise time of approximately 50 ns. FIG. 4 is a schematic of a typical prior art electrical circuit for delivering high voltage pulses.

As shown in FIG. 4, a constant high voltage of, for example, 20 to 30 kV, is applied to the ion source (which is the sample 16, in the preferred embodiment) from a constant high voltage power supply 60 connected to the sample holder 15. When the switch 52 is closed, the additional voltage of the pulsing supply 50 is added to the constant high voltage. This design requires a bulky high voltage isolation transformer (not shown) for the pulsing supply 50, and the switch 52 floats (is electrically isolated) at approximately 30 kV above ground, requiring special electrical isolation for triggering each pulse.

Examples of electrical circuits are given in M. L. Vestal, P. Juhasz, S. A. Martin, *Rapid Communications in Mass Spectrometry*, Vol. 9, pp. 1044–1050 (1995) and in R. S. Brown and J. J. Lennon, "Mass Resolution Improvement by Incorporation of Pulsed Ion Extraction in a Matrix-Assisted Laser Desorption/Ionization Linear Time-of-Flight Mass Spectrometer," *Analytical Chemistry*, Vol. 67, No. 13, pp. 1998–2003 (Jul. 1, 1995). The Vestal apparatus requires three power supplies, and though none of them must be floated, the switch must float at up to 30 kV. The Brown apparatus uses only two power supplies, but one of them must be floated, requiring isolation as described above. Both the Vestal apparatus and the Brown apparatus are more costly to implement, and require more space.

Figure 5:
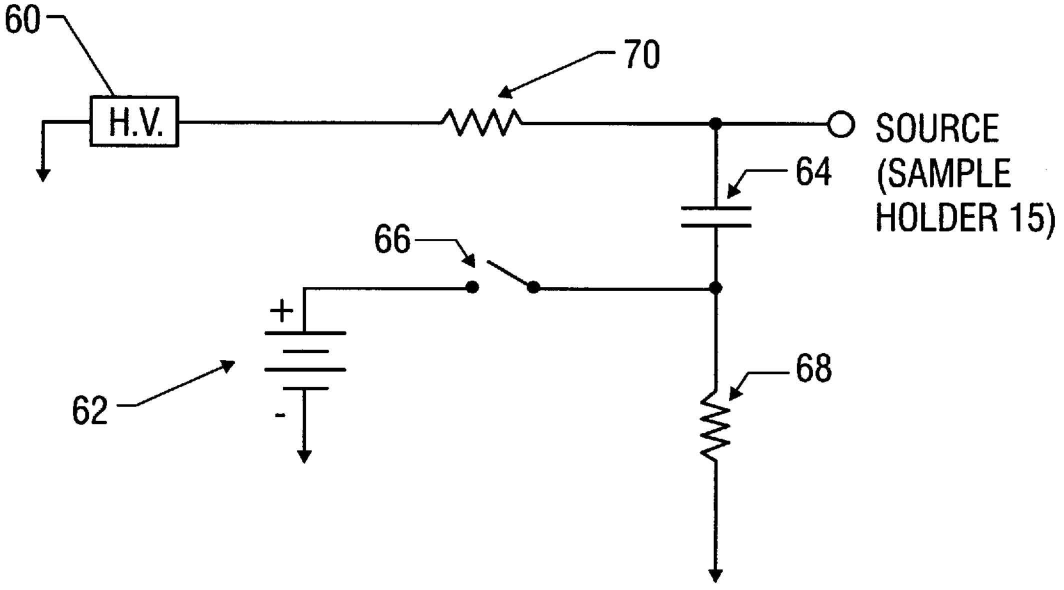
FIG. 5 is a schematic of an electrical circuit in accordance with the invention.

The present invention provides significant advantages over the prior art. In accordance with the invention, FIG. 5 illustrates an electrical circuit for delivering high voltage pulses for pulsed delayed ion extraction. Only two power supplies are required, and electrical isolation from ground is not necessary. In the simple form shown in FIG. 5, the pulse power supply 62 is coupled to the source through a capacitor 64. A constant high voltage power supply 60 delivers a constant 20 to 30 kV DC bias to the source.

Closing the switch 66, which is preferably a Behlke high voltage switch but can be any high voltage switch capable of switching the voltages present in the invention, causes the voltage from the pulse power supply 62 to be placed across the bias (or "pull-down") resistor 68, and coupled through the coupling capacitor 64 to the source, where it is superimposed on the high voltage supplied by the constant high voltage power supply 60.

When the switch 66 is opened, the bias resistor 68 brings the pulse power supply side of the coupling capacitor 64 back to ground, with an RC time constant determined by the capacitance of the coupling capacitor 64 and the resistance of the bias resistor 68. The pulse power supply 62 is at ground reference, and the switch 66 can accept voltage differences of 8 kV to 30 kV, which is commercially feasible. The high voltage supply isolation resistor 70 effectively isolates the high voltage power supply from the voltage pulse. Alternatively, a high-speed, high-voltage diode could be substituted for the isolation resistor 70.

Figure 6:
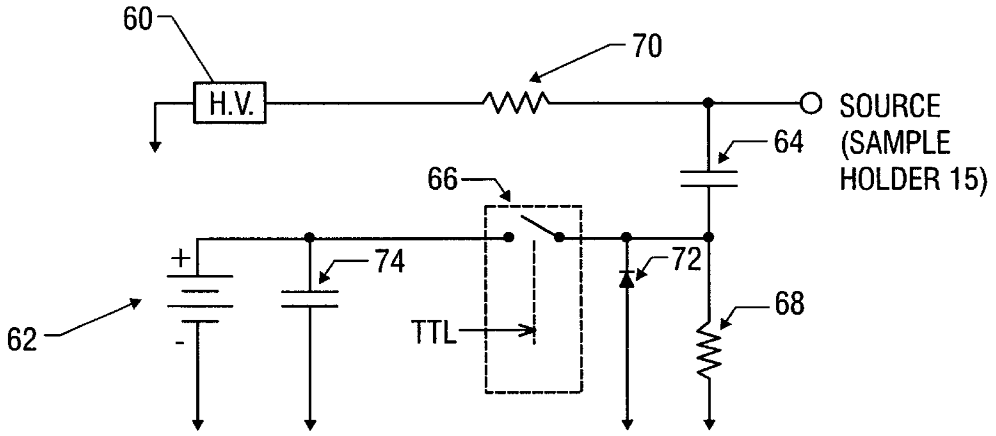
FIG. 6 is a schematic of another electrical circuit in accordance with the invention.

Another embodiment of the electrical circuit in accordance with the invention is shown in FIG. 6. A shunt diode 72 is placed across the bias resistor 68, and an energy storage capacitor 74 is placed across the pulse power supply 62. The addition of the shunt diode 72 protects the switch 66 against reverse voltages in the event of a short to ground in the source, while the energy storage capacitor 74 permits longer ON times (>10 $\mu$s) for each pulse with little voltage droop. Further, in this figure, the solid state switch 66 is shown with a TTL (transistor-to-transistor logic) input.

Figure 7:
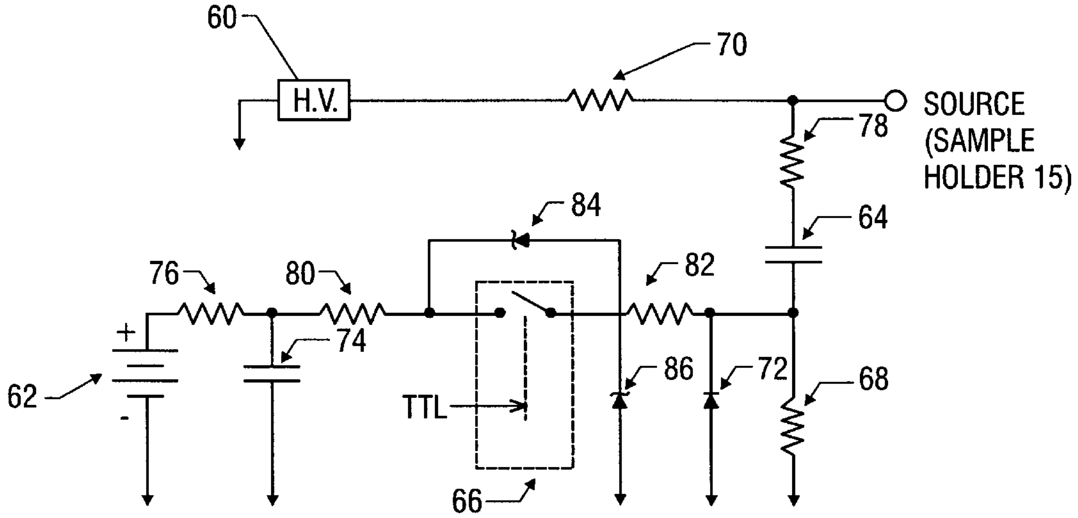
FIG. 7 is a schematic of a further electrical circuit in accordance with the invention.

FIG. 7 illustrates a further embodiment of the electrical circuit in accordance with the invention. An energy storage capacitor 74 is charged by the pulse power supply 62 through the pulse power supply isolation resistor 76, while the coupling capacitor 64 transfers the voltage pulse to the high voltage bias on the ion source. A matching resistor 78 is placed between the coupling capacitor 64 and the ion source, and load resistors 80 and 82 are placed inline with the TTL-controlled switch 66. Zener diodes 84 and 86 are placed across the switch 66 and between the load side of the switch 66 and ground. The constant high voltage power supply isolation resistor 70 effectively isolates the voltage pulse from the constant high voltage supply 60. The two load resistors 80 and 82 limit the current through the switch 66 to a value below its peak current rating, while the matching resistor 78 is chosen to minimize ringing or overshoot. The pulse power supply isolation resistor 76 is chosen to control recharging of the energy storage capacitor 74 between pulses without overloading the pulse power supply 62. Finally, the "Transorb" voltage protection diodes 84 and 86 protect the switch 66 against any transients resulting from a short in the ion source.

In the embodiment of FIG. 7, when a control pulse closes the switch 66, the voltage across the energy storage capacitor 74 is added to the pulse power supply side of the coupling capacitor 64 through the load resistors 80 and 82. When the switch 66 opens, the pulse power supply side of the coupling capacitor 64 is brought back to ground by the bias resistor 68.

In the preferred embodiment, the constant high voltage power supply 60 produces 18 kV, but may also produce 10 kV to 30 kV. The capacitance of the coupling capacitor 64 is 20 to 50 times the source capacitance, and is 470 pF with a rating of 40 kV. The capacitance of the energy storage capacitor 74 is preferably 20 times the capacitance of the coupling capacitor 64, and is 0.2 $\mu$F with a voltage rating greater than that of the pulse power supply 62. The bias resistor 68, at 100 k$\Omega$, is chosen to be large enough not to impose a significant load on the energy storage capacitor 74, but small enough to discharge the coupling capacitor 64 in less than 50 $\mu$s. The constant high voltage power supply isolation resistor 70 is 1 to 10 M$\Omega$, while the pulse power supply isolation resistor 76 is 100 k$\Omega$. The matching resistor 78 is 20 to 200 $\Omega$, while the voltage protection diodes 84 and 86 are 7,900 V transient suppression diodes that, in conjunction with the load resistor 82 and the shunt diode 72, serve to protect the switch 66 from reverse voltages in the event of a short to ground in the ion source. The shunt diode 72 is selected for fast turn-on. The load resistors 80 and 82 are 240 $\Omega$ and 47 $\Omega$, respectively, to limit the peak current through the switch 66. The switch 66 can be any commercial high voltage switch that can handle at least 8 kV and has a switching time of around 20 ns. In this embodiment, the switch 66 is a Behlke HTS 81.

Figure 8A:
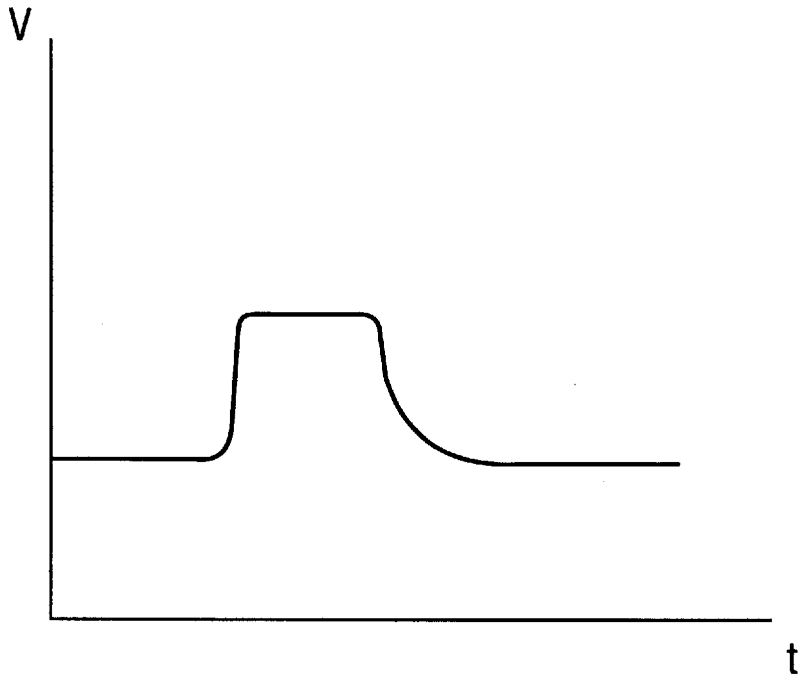
FIG. 8(A) and FIG. 8(B) are graphs indicating sample pulses which may be used in accordance with the invention.
Figure 8B:
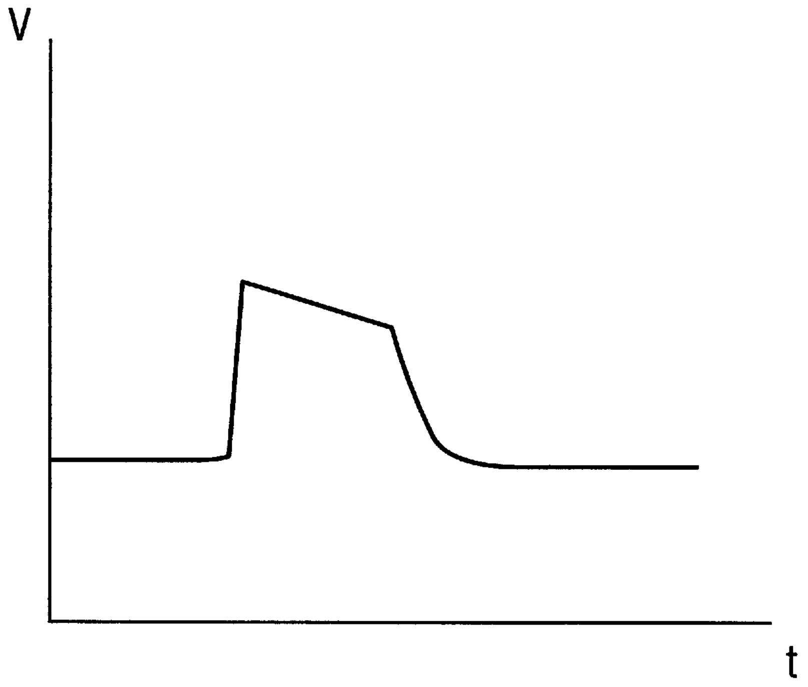

By changing the capacitance of the coupling capacitor 64 or the resistance of the bias resistor 68, the shape of the pulse may be altered. Examples of possible pulse shapes are given in FIG. 8(A) and 8(B).

3. TOF TUBE AND ALIGNMENT SYSTEM

The process of desorbing and ionizing molecules of the sample 16 results in the production of neutral atoms and molecules, either from the desorption process or from neutralization of ions in close proximity to the sample. These neutral particles are not accelerated by the electric fields in the mass spectrometer 10 and thus do not provide useful data for the TOF spectral analysis. On the other hand, the neutral particles increase background noise and reduce the useful life of the ion detector. It is therefore desirable to reduce the neutral particle flux (also referred to as "neutral blast") toward the ion detector.

Referring to FIGS. 1(A), (*b*), and (C), the TOF tube 12 (or time-of-flight tube axis 2) is placed at an angle to the initial path of the ions exiting the ion optics 20, so that there is no direct path from the sample 16 to the ion detector. In the preferred embodiment, the TOF tube 12 is angled at 4° or 5° from the path of the ion beam through the ion optics 20, although a range of 3° to 10° may be used. As shown in FIG. 3, deflecting plates 46 and 48 are placed along the path of the beam. When voltage is applied to the deflecting plates 46 and 48, they generate an electric field which deflects the ion beam to follow the angled TOF tube 12. The neutral particle flux, however, is not deflected by the deflecting field and as a result, the ion detector is relatively protected from the neutral blast. The ion beam path 3 may be offset from the axis 2 of the TOF tube 12.

In an alternative embodiment, the TOF tube 12 may be placed with its axis parallel to, but not collinear with, the path of the ions 3 exiting the ion optics 20, so that there is no direct path from the sample 16 to the ion detector. Additional deflecting plates, similar to deflecting plates 46 and 48, may be used to guide the ion flux along the TOF tube 12. Thus, one set of deflecting plates would deflect the ion beam along a path at an angle to the initial path of the ions, and the other set of deflecting plates would deflect the deflected ion beam along a path parallel to, but offset from, the initial path of the ions.

The apparatus further includes an alignment system for aligning the ion optics 20 with the laser beam used for desorption/ionization. A small tube 90 is attached to the TOF tube 12 (or time-of-flight tube axis 2) with its axis along the path of the ion beam through the ion optics 20. An alignment light 92 is placed such that it shines down the tube 90 and through the aperture 24 in the conical first electrode 22 to project a 4 mm disc of light onto the sample 16. In the preferred embodiment, the alignment light 92 produces incoherent visible light, and may be an incandescent light. The preferred alignment light 92 is a tungsten bulb with a projection lens from a commercial microscope illuminator, made by Leica. The lasing apparatus 18, which typically includes an adjustable steering mirror 5, is adjusted to bring the laser beam into alignment within the center of the disc of light. A fluorescent material, such as a MALDI matrix, will fluoresce when an ultraviolet laser beam impinges on the sample 16, enabling the operator to center the laser beam within the light circle using the steering mirror 5. Alternatively, a sighting apparatus using visible light may be used to indicate the aiming of the laser or other ionizing beam.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

Although the present invention has been described above in terms of specific embodiments, it is anticipated that alterations and modifications to this invention will no doubt become apparent to those skilled in the art. For example, the switch in the pulse electrical circuit may be ground referenced and used in conjunction with a negative voltage from the pulse power supply. Additionally, although the invention has been described for use in conjunction with laser desorption and ionization, other methods of desorption and ionization may be used, such as electron impact ionization or an ion gun. It is therefore intended that the following claims be interpreted as covering all such alterations and modifications as fall within the true spirit and scope of the invention.

We claim:

1. A time-of-flight mass spectrometer comprising:

a) a first electrode which has a funnel shape; and b) a second electrode, placed adjacent to the first electrode and arranged in conjunction with the first electrode such that the axes of the electrodes are aligned and a flow of ions of the sample may pass through the first and second electrodes, wherein an end of the second electrode protrudes into a wide opening of the first electrode and wherein the time-of-flight tube has a longitudinal axis defining a deflected path with an acute angle between the deflected path and the flow of ions through the first and second electrodes.

2. The mass spectrometer as recited in claim 1, further comprising a deflector configured to deflect the flow of ions along the deflected path.

3. The mass spectrometer as recited in claim 2, further comprising a first insulating member and a second insulating member, the first electrode being mounted to the first insulating member and the second electrode being mounted to the second insulating member.

4. The mass spectrometer as recited in claim 2, further comprising an ionizer configured to produce ions of the sample.

5. The mass spectrometer as recited in claim 4, wherein the ionizer is a laser.

6. A mass spectrometer comprising an alignment system configured to facilitate alignment of a first electrode, a sample, an ionizing beam produced by an ionizer, and a time-of-flight tube, wherein the time-of-flight tube has a longitudinal axis defining a deflected path with an acute angle between the deflected path and the path of the flow of ions through the first electrode and a second electrode.

7. The mass spectrometer as recited in claim 6, wherein the alignment system includes an aligning tube having a longitudinal axis along the path of the flow of ions through the first and second electrodes.

8. The mass spectrometer as recited in claim 7, wherein the alignment system further includes an illuminator configured to shine light through the aligning tube and through the first electrode.

9. The mass spectrometer as recited in claim 8, wherein the alignment system further includes a steering mirror adjustable to align the ionizing beam with the light on the sample.

10. The mass spectrometer as recited in claim 9, wherein the ionizer is a laser.

11. The mass spectrometer as recited in claim 10, further comprising a capacitor configured to capacitively couple a pulse power supply to at least one of the sample, the first electrode, and the second electrode.

12. The mass spectrometer as recited in claim 11, further comprising:

a switch having a source side in communication with the pulse power supply and a load side in communication with the coupling capacitor, the switch being configured to couple the pulse power supply to the coupling capacitor when the switch is closed;

a bias resistor connected to the load side of the switch and through which the pulse power supply is connected to ground when the switch is closed; and a constant voltage supply which is coupled, through a constant voltage supply isolation resistor, to at least one of the sample, the first electrode, and the second electrode, the constant voltage supply isolation resistor being configured to limit pulse power supply current toward the constant voltage supply.

13. The mass spectrometer as recited in claim 12, further comprising:

an energy storage capacitor placed across the pulse power supply;

a shunt diode placed across the bias resistor, the shunt diode being configured to protect the switch against reverse voltages;

a pulse power supply isolation resistor which connects the pulse power supply and the energy storage capacitor, and is configured to limit current from the pulse power supply;

a first load resistor, which couples the pulse power supply isolation resistor to the source side of the switch;

a first zener diode coupling the load side of the switch to the source side of the switch;

a second zener diode coupling ground to the load side of the switch;

a second load resistor, which couples the load side of the switch to the shunt diode, bias resistor, and coupling capacitor; and a matching resistor, which connects the coupling capacitor to the mass spectrometer and to the constant high voltage supply isolation resistor.

14. The mass spectrometer as recited in claim 6, further comprising an ionizer configured to produce ions from the sample, wherein the first electrode has a conical shape and the second electrode is placed with a proximal end protriding into an interior volume of the first electrode and shaped such that a distance between the proximal end of the second electrode and the first electrode is smaller than a distance between any other part of the second electrode and the first electrode.

15. The mass spectrometer as recited in claim 14, wherein the first and second electrodes are configured to define the path along which the ions may flow.

16. The mass spectrometer as recited in claim 15, further comprising a deflector configured to deflect the flow of ions along the deflected path.

17. A mass spectrometer comprising:

a) an ionizer configured to produce ions of the sample;

b) a first electrode having a conical shape;

c) a second electrode axially aligned with the first electrode, placed with a proximal end protruding into an interior volume of the first electrode and with an end protruding into an aperture at a base of the first electrode and shaped such that a distance between the proximal end of the second electrode and the first electrode is smaller than a distance between any other part of the second electrode and the first electrode; and d) a capacitor for pulsed delayed ion extraction configured to capacitively couple a power supply to at least one of the sample, the first electrode, and the second electrode; wherein the first and second electrodes are spaced apart by at least one electrically insulating member and configured to define a path along which the ions may flow.

18. The mass spectrometer as recited in claim 17, further comprising a switch having a switching time of no longer than about 20 ns and configured to couple the power supply to the capacitor.

19. The mass spectrometer as recited in claim 18, further comprising a bias resistor coupling the switch to ground and through which the power supply is connected to ground when the switch is closed.

20. The mass spectrometer as recited in claim 19, further comprising a constant voltage supply configured to supply a constant voltage through a constant voltage supply isolation resistor to at least one of the sample, the first electrode, and the second electrode, to which the power supply is capacitively coupled through the capacitor.

21. The mass spectrometer as recited in claim 18, further comprising an alignment system configured to facilitate alignment of the first electrode, the sample and an ionizing beam produced by the ionizer with a time-of-flight tube, wherein the time-of-flight tube has a longitudinal axis defining a deflected path with an acute angle between the deflected path and the path of the flow of ions through the first electrode and a second electrode.

22. A time-of-flight mass spectrometer, comprising:

(a) ion optics defining a path for a flow of ions of a sample;

(b) a time-of-flight tube having a longitudinal axis which defines a deflected path with an acute angle between the deflected path and the path of the flow of ions through the ion optics; and (c) an alignment system configured to facilitate alignment of an ionizing beam with the ion optics and the sample.

23. The mass spectrometer as recited in claim 22, wherein the alignment system comprises an aligning tube axially aligned with the path of the flow of ions through the ion optics.

24. The mass spectrometer as recited in claim 23, wherein the aligning tube is affixed to the time-of-flight tube.

25. The mass spectrometer as recited in claim 23, wherein the alignment system further comprises an illuminator configured to shine light through the aligning tube and the ion optics onto the sample.

26. The mass spectrometer as recited in claim 25, further comprising a steering mirror adjustable to align the ionizing beam with the light on the sample.

27. The mass spectrometer as recited in claim 26, further comprising an ionizer configured to produce the ionizing beam.

28. The mass spectrometer as recited in claim 27, wherein the ionizer is a laser.

29. An article of manufacture, comprising:

a) a time-of-flight mass spectrometer; and b) a coupling capacitor for pulsed delayed ion extraction configured to capacitively couple a pulse power supply to the mass spectrometer.

30. The article of manufacture as recited in claim 29, further comprising a switch having a switching time of no longer than about 20 ns and having a source side in communication with the pulse power supply and a load side in communication with the coupling capacitor, the switch being configured to couple the pulse power supply to the coupling capacitor when the switch is closed.

31. The article of manufacture as recited in claim 30, further comprising a bias resistor connected to the load side of the switch and through which the pulse power supply is connected to ground when the switch is closed.

32. The article of manufacture as recited in claim 31, further comprising a constant voltage supply which is coupled, through a constant voltage supply isolation resistor, to the mass spectrometer together with the capacitively coupled pulse power supply, the constant voltage supply isolation resistor being configured to limit pulse power supply current toward the constant voltage supply.

33. The article of manufacture as recited in claim 32, further comprising an energy storage capacitor placed across the pulse power supply and a shunt diode placed across the bias resistor, the shunt diode being configured to protect the switch against reverse voltages in the mass spectrometer.

34. The article of manufacture as recited in claim 33, further comprising:

(a) a pulse power supply isolation resistor which connects the pulse power supply and the energy storage capacitor, and is configured to limit current from the pulse power supply;

(b) a first load resistor, which couples the pulse power supply isolation resistor to the source side of the switch;

(c) a first zener diode coupling the load side of the switch to the source side of the switch;

(d) a second zener diode coupling ground to the load side of the switch;

(e) a second load resistor, which couples the load side of the switch to the shunt diode, bias resistor, and coupling capacitor; and (f) a matching resistor, which connects the coupling capacitor to the mass spectrometer and to the constant high voltage supply isolation resistor.

35. The mass spectrometer as recited in claim 30, further comprising an alignment system configured to facilitate alignment of the ion optics, a sample, and an ionizing beam produced by the ionizer with a time-of-flight tube, wherein the time-of-flight tube has a longitudinal axis defining a deflected path with an acute angle between the deflected path and the path of the flow of ions through the ion optics.

36. An electrical circuit for delivering high voltage pulses to a time-of-flight mass spectrometer comprising:

a) a pulse power supply; and b) a coupling capacitor for pulsed delayed ion extraction configured to capacitively couple said pulse power supply to the time-of-flight mass spectrometer.

37. The electrical circuit as recited in claim 36, further comprising a speed switch having a switching capacity of no longer than about 20 ns and having a source side in communication with the pulse power supply and a load side in communication with the coupling capacitor, the switch being configured to couple the pulse power supply to the coupling capacitor when the switch is closed.

38. The electrical circuit as recited in claim 37, further comprising a bias resistor connected to the load side of the switch and through which the pulse power supply is connected to ground when the switch is closed.

39. The electrical circuit as recited in claim 38, further comprising a constant voltage supply which is coupled, through a constant voltage supply isolation resistor, to the mass spectrometer together with the capacitively coupled pulse power supply, the constant voltage supply isolation resistor being configured to limit pulse power supply current toward the constant voltage supply.

40. The electrical circuit as recited in claim 39, further comprising an energy storage capacitor placed across the pulse power supply and a shunt diode placed across the bias resistor, the shunt diode being configured to protect the switch against reverse voltages in the mass spectrometer.

41. The electrical circuit as recited in claim 40, further comprising:

a) a pulse power supply isolation resistor which connects the pulse power supply and the energy storage capacitor, and is configured to limit current from the pulse power supply;

b) a first load resistor, which couples the pulse power supply isolation resistor to the source side of the switch;

c) a first Zener diode coupling the load side of the switch to the source side of the switch;

d) a second Zener diode coupling ground to the load side of the switch;

e) a second load resistor, which couples the load side of the switch to the shunt diode, bias resistor, and coupling capacitor; and f) a matching resistor, which connects the coupling capacitor to the mass spectrometer and to the constant high voltage supply isolation resistor.

* * * * *

UNITED STATES PATENT AND TRADEMARK OFFICE

CERTIFICATE OF CORRECTION

PATENT NO. : 5,864,137

DATED : January 26, 1999

INVENTOR(S) : Becker et al.

It is certified that error appears in the above-identified patent and that said Letters Patent is hereby corrected as shown below:

On the title page, item [57], line 9, after 'comprises', please delete "a n", and insert the following therefor: -- an --.

Signed and Sealed this

First Day of June, 1999

Attest:

Q. TODD DICKINSON

*Attesting Officer*

*Acting Commissioner of Patents and Trademarks*